United States Patent
Ikuta

(10) Patent No.: US 7,876,800 B2
(45) Date of Patent: Jan. 25, 2011

(54) SURFACE EMITTING LASER

(75) Inventor: Mitsuhiro Ikuta, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 182 days.

(21) Appl. No.: 12/105,481

(22) Filed: Apr. 18, 2008

(65) Prior Publication Data
US 2009/0232179 A1 Sep. 17, 2009

(30) Foreign Application Priority Data
Apr. 20, 2007 (JP) ............... 2007-111318

(51) Int. Cl.
*H01S 5/00* (2006.01)
(52) U.S. Cl. ............... 372/50.124; 372/43.01; 372/44.01; 372/50.12
(58) Field of Classification Search ......... 372/43.01, 372/44.01, 46.01, 46.014–50.124, 90–104
See application file for complete search history.

(56) References Cited

U.S. PATENT DOCUMENTS

| | | | | |
|---|---|---|---|---|
| 6,154,480 | A * | 11/2000 | Magnusson et al. | 372/96 |
| 2007/0036189 | A1 * | 2/2007 | Hori et al. | 372/50.11 |
| 2007/0258499 | A1 * | 11/2007 | Mochizuki | 372/50.1 |
| 2008/0107145 | A1 | 5/2008 | Hori et al. | 372/99 |
| 2008/0112442 | A1 | 5/2008 | Ikuta | 372/19 |
| 2008/0117942 | A1 | 5/2008 | Nagatomo et al. | 372/19 |

FOREIGN PATENT DOCUMENTS

JP   2003-273453   9/2003

OTHER PUBLICATIONS

Shimada, et al., "Strong Localization of Bloch Photons in Dual-Periodic Dielectric Multilayer Structures", J. Appl. Phys., vol. 90, No. 8, 3905-3909 (2001).

* cited by examiner

*Primary Examiner*—Minsun Harvey
*Assistant Examiner*—Xnning Niu
(74) *Attorney, Agent, or Firm*—Fitzpatrick, Cella, Harper & Scinto

(57) ABSTRACT

A surface emitting laser having a photonic crystal layer 130 on a substrate 105 with an active layer therebetween, in which the photonic crystal layer includes at least a first periodic structure for resonating in an in-plane direction and a second periodic structure for modulating a light intensity distribution in an in-plane direction. The light intensity in the photonic crystal layer is periodically distributed to a region having high light intensity and a region having low light intensity by the second periodic structure. Further, a conductive film 170 for performing current injection into the active layer is selectively provided just above the region having low light intensity. The surface emitting laser provides suppression of light absorption and highly efficient current injection into an active layer to attain a high power.

8 Claims, 5 Drawing Sheets

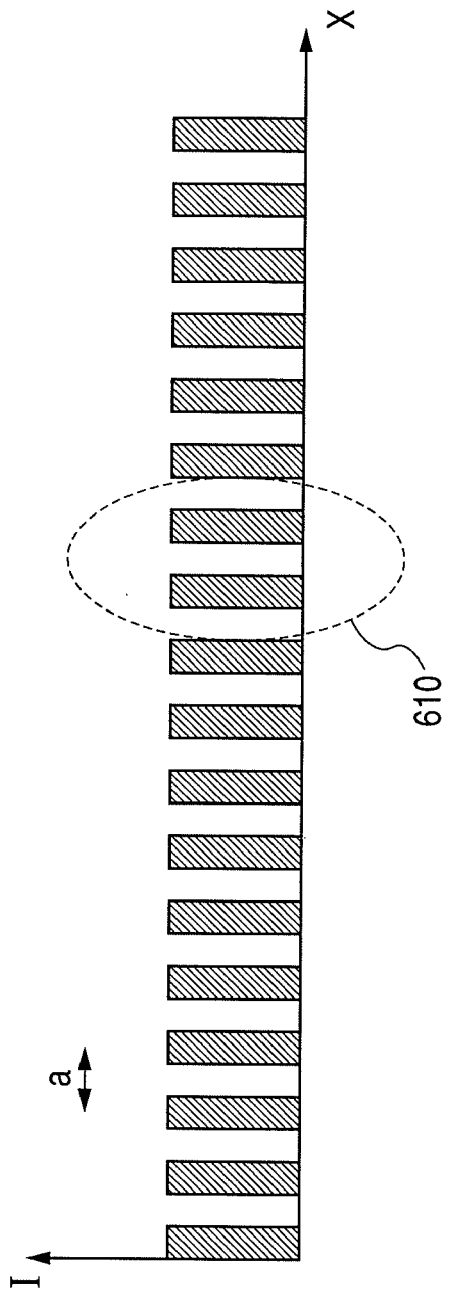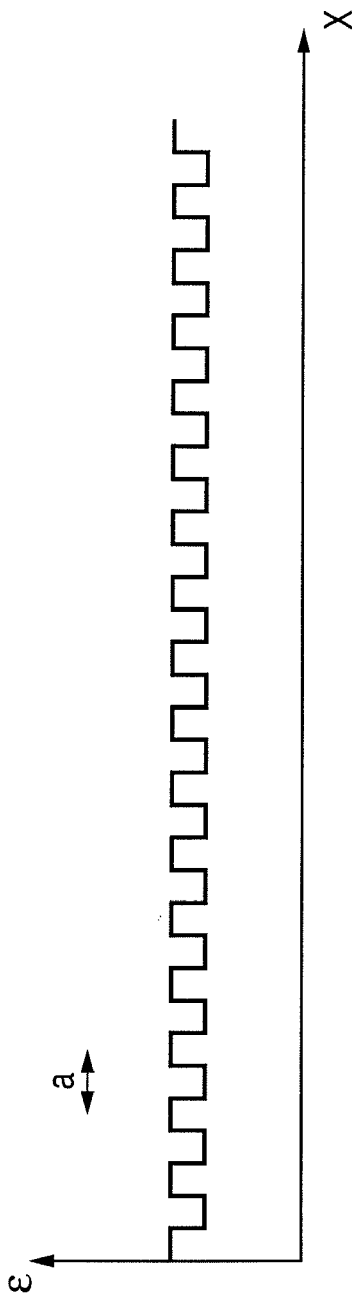
FIG. 6A
FIG. 6B

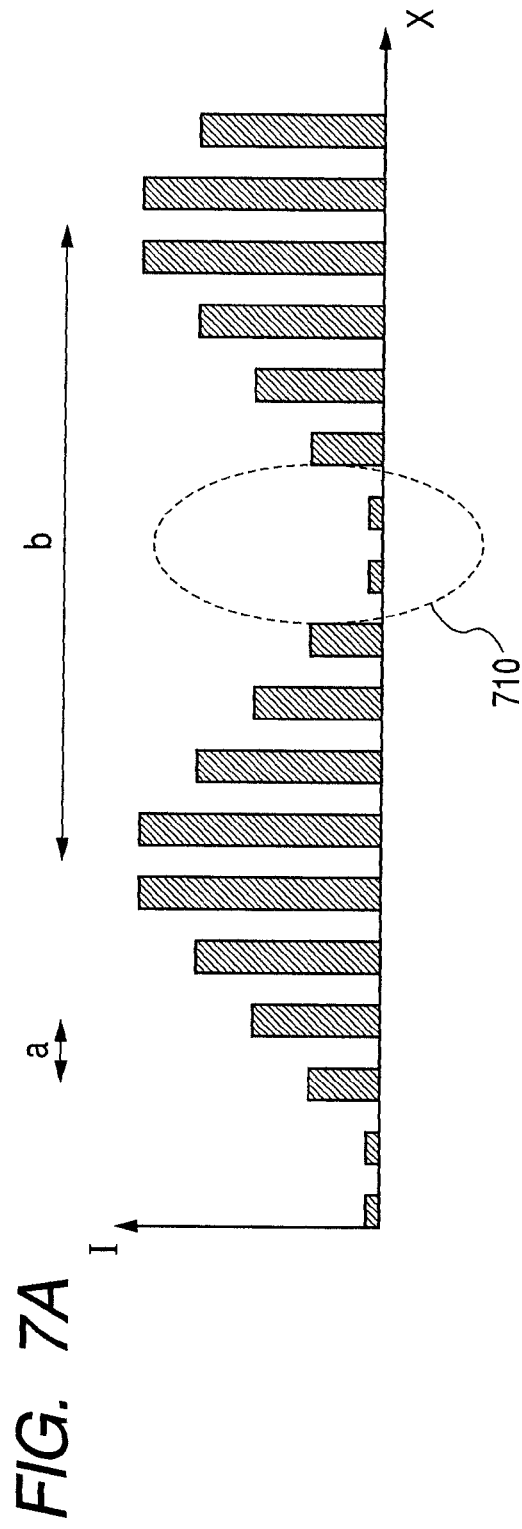
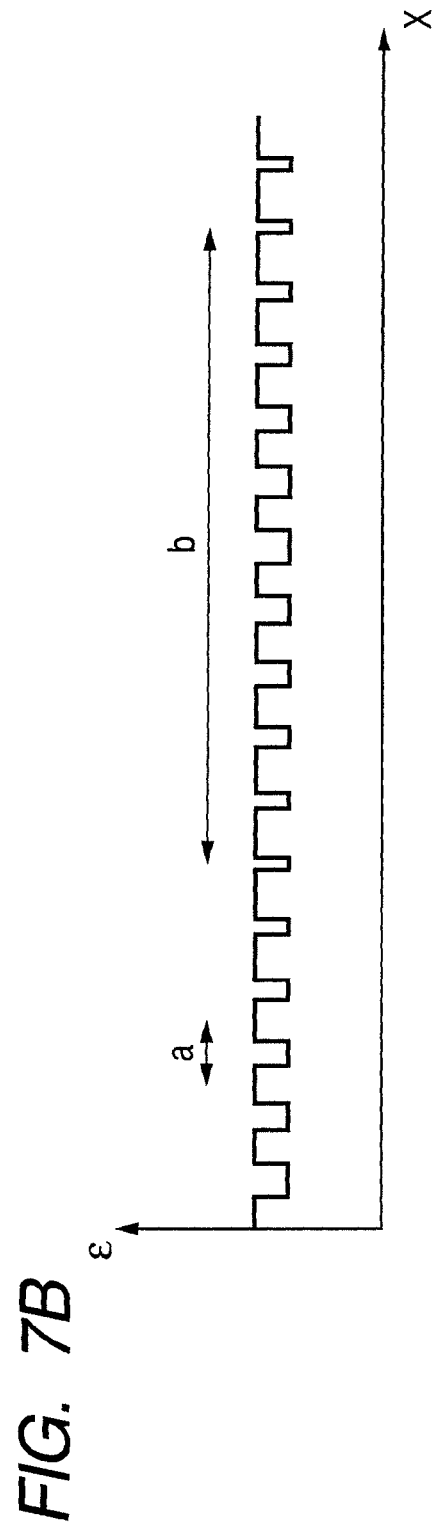

SURFACE EMITTING LASER

BACKGROUND OF THE INVENTION

1. Field of the Invention

The present invention relates to a surface emitting laser and, in particular, to a high-power surface emitting laser.

2. Description of the Related Art

Recent attention has focused on a surface emitting laser as a light source for optical communication, optical transmission or electrophotography.

The surface emitting laser has excellent characteristics such as a single longitudinal mode, a low threshold and easy two-dimensional array formation.

For such a surface emitting laser, development of two-dimensional photonic crystal surface emitting laser utilizing a photonic crystal has been accelerated.

The photonic crystal used herein is a structure having a refractive index period equal to or smaller than the wavelength of light.

A two-dimensional photonic crystal surface emitting laser as disclosed in Japanese Patent Application Laid-Open No. 2003-273453 has a photonic crystal periodic structure arranged with a refractive index period in a two-dimensional manner in the vicinity of an active layer which light-emits by injecting carriers and is adapted to perform surface emitting with resonance by a photonic crystal.

The surface emitting laser disclosed in Japanese Patent Application Laid-Open No. 2003-273453 described above, constituting a surface emitting laser with unnecessary regrowth or laminating process, specifically, has such a structure as illustrated in FIG. 5.

The surface emitting laser, as illustrated in FIG. 5, has a lower clad 12, an active layer 13 and an upper clad 14 layered on a substrate 11.

At the central portion of the upper clad layer 14, there is provided a light-emitting region having a photonic crystal periodic structure 21 as a laser resonator and, around thereof, a ring-shaped upper electrode 17 is disposed.

The surface emitting laser is adapted to cause the active layer 13 to emit light for laser oscillation by injecting carriers into the active layer from a lower electrode 16 under the upper electrode 17 and the substrate 11.

On the other hand, U.S. Pat. No. 6,154,480 has proposed a vertical resonator type surface emitting laser constructed as a resonator mirror by utilizing guided mode resonance, hereinafter referred to as "GMR", using a slab having a photonic crystal. In the surface emitting laser, the photonic crystal formed on a slab guided wave path makes a guided wave mode of the slab guided wave path resonate with a radiation mode for emitting light to the outside of the slab. Thus, the photonic crystal slab can remarkably decrease the transmittance of the incident light from the direction perpendicular to a surface of the slab guided wave path or can remarkably increase reflectance in a resonance wavelength of GMR. Specifically, the slab guided wave path having a photonic crystal structure can have a function as a mirror. The mirror having a photonic crystal structure and another mirror (for example, another mirror of the same type or multi-layer film reflector) are faced each other, sandwiching an active layer to constitute a vertical resonator. The surface emitting laser, which performs laser oscillation by injecting carriers into the active layer from an electrode through the photonic crystal structure mirror, has been disclosed as one embodiment.

However, the surface emitting lasers of conventional examples disclosed in Japanese Patent Application Laid-Open No. 2003-273453 and U.S. Pat. No. 6,154,480 have following problem in attaining a high power.

In the surface emitting laser utilizing a photonic crystal layer, it is desirable that an electrode for injecting a current into the active layer does not absorb the light generated at the active layer as much as possible, from the viewpoint of light emitting efficiency of laser. Generally, the electrode is disposed in a location other than the vicinity of a photonic crystal region. This is because in Japanese Patent Application Laid-Open No. 2003-273453 and U.S. Pat. No. 6,154,480, light resonates to increase the light intensity in the photonic crystal region and, if an absorber exists in the vicinity thereof, resonant light is strongly absorbed there. Accordingly, Japanese Patent Application Laid-Open No. 2003-273453 has proposed that a ring-shaped electrode is arranged around so as to surround a photonic crystal, thereby restraining light absorption.

Under such a configuration, if the area of a photonic crystal region is widened to attain a high power, the ring inner diameter of a ring-shaped electrode surrounding the photonic crystal region must be also increased. As a result, there occurs a disadvantage that carrier injection is not performed fully enough to reach an active layer. Specifically, the diffusion length of carriers in a semiconductor is not so large, so that the carriers are not fully injected to reach the central portion of a light-emitting region positioned under the center of the ring-shaped electrode and formed from the active layer. Accordingly, current injection efficiency drops, which makes it difficult to obtain a high laser beam output.

On the other hand, by providing an electrode or a conductive film over the whole surface of the top of the photonic crystal, placing priority on efficient carrier injection into the active layer, light absorption is intensified by the electrode or conductive film. Thus, a high laser beam output is difficult to obtain.

It is an object of the present invention to provide a surface emitting laser capable of solving the foregoing problems and suppressing light absorption as well as attaining highly efficient current injection into an active layer to attain a high power.

SUMMARY OF THE INVENTION

The present invention is directed to a surface emitting laser having a photonic crystal layer on a substrate with an active layer intervening therebetween, wherein the photonic crystal layer includes a first periodic structure for resonating in an in-plane direction and a second periodic structure for modulating a light intensity distribution in the in-plane direction; the light intensity in the photonic crystal layer is periodically distributed to a region having high light intensity and a region having low light intensity by the second periodic structure; and a conductive film for performing current injection into the active layer is selectively provided just above the region having low light intensity.

The first periodic structure can be a short-periodic structure in a shorter period than a vacuum wavelength of light resonated in the in-plane direction and the second periodic structure can be a long-periodic structure in a longer period than the vacuum wavelength of light.

The short-periodic structure can be of two-dimensional square lattice of holes or two-dimensional triangular lattice of holes. In the surface emitting laser, voids of the holes can be filled with a dielectric material.

The long-periodic structure can be configured by one-dimensionally or two-dimensionally adding a period modulation to the diameter of each of the holes or the depth of each of the holes.

The photonic crystal layer can be provided with an upper electrode around the photonic crystal layer with the conductive film intervening between the upper electrode and the photonic crystal layer. The conductive film and the electrode can be made of the same material.

The conductive film can be formed with a thin film.

The surface emitting laser according to the present invention enables suppression of light absorption as well as highly efficient current injection into an active layer to attain a high power.

Further features of the present invention will become apparent from the following description of exemplary embodiments with reference to the attached drawings.

BRIEF DESCRIPTION OF THE DRAWINGS

FIGS. 6A and 6B are schematic views of a dielectric constant distribution and a light intensity distribution in a photonic crystal structure at a single period.

FIGS. 7A and 7B are schematic views of dielectric constant distribution and a light intensity distribution in a photonic crystal structure according to the present invention.

DESCRIPTION OF THE EMBODIMENTS

Figure 1:
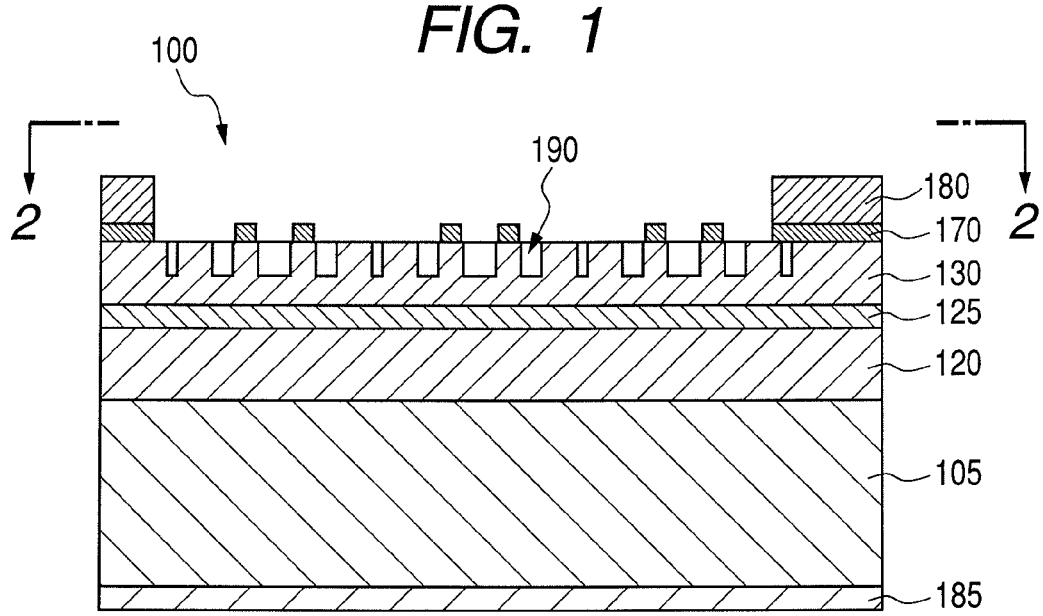
FIG. 1 is a sectional schematic view of a surface emitting laser according to one embodiment of the present invention.

Description will be made on a surface emitting laser according to an embodiment of the present invention.

Specifically, this laser is a surface emitting laser having a photonic crystal layer on a substrate with an active layer therebetween. The photonic crystal layer has at least two types of periodic structures.

The two types of periodic structures are a first periodic structure for resonance in an in-plane direction and a second periodic structure for modulating an intensity distribution of light in an in-plane direction in the resonance mode.

One of the features of the present invention is that a period of the second periodic structure is longer than that of the first periodic structure.

In the intensity distribution of light within the photonic crystal layer, the magnitude of intensity distribution spatially changes with a period of the first periodic structure. In addition, a light intensity is spatially distributed moderately to a region having high light intensity and a region having low light intensity with periodicity by the second periodic structure.

Just above the region having low light intensity, a conductive film for current injection into the active layer is selectively provided. The conductive film is not always required to be provided only just above the region having low light intensity and may be formed just above the region having high light intensity unless a low light intensity due to the provision of the conductive film causes a problem.

However, in a total area of the region having high light intensity and the region having low light intensity, an area of the conductive film provided just above the region having low light intensity can be larger than that of the conductive film provided just above the region having high light intensity. Accordingly, in the surface emitting laser according to the present embodiment, the conductive film is selectively provided in the region having low light intensity.

Using such a configuration, there can be obtained a surface emitting laser which has a photonic crystal layer on a substrate with an active layer therebetween, and enables suppression of light absorption as well as highly efficient carrier injection to attain a high power.

The first periodic structure functions so as to resonate in an in-plane direction within a photonic crystal layer in a short period. The second periodic structure functions to modulate a resonance light intensity distribution by the first periodic structure to a longer period in an in-plane direction.

Specifically, the first periodic structure is made into a short periodic structure in a shorter period than a vacuum wavelength of light resonated in the in-plane direction, while the second periodic structure is made into a long periodic structure in a longer period than the vacuum wavelength of light.

A conductive film is provided in a region over the photonic crystal layer periodically modulated into an intensity distribution with the low intensity distribution of light caused by the second periodic structure, so that carriers are injected into the active layer through the conductive layer.

Referring now to drawings, the concept will be described below.

FIG. 6B and FIG. 7B are schematic views of examples of dielectric constant distributions of a photonic crystal structure, and FIG. 6A and FIG. 7A are schematic views of examples of light intensity distributions in a resonance mode determined corresponding to the dielectric constant distributions. Each vertical axis of graphs in FIGS. 6A and 7A indicates light intensities and each vertical axis of graphs in FIGS. 6B and 7B indicates dielectric constants. Even if the dielectric constant is replaced by refractive index, the following discussion will not be affected essentially. Each horizontal axis of graphs in FIGS. 6A and 7A and FIGS. 6B and 7B indicates space positions.

FIG. 6B indicates an example of a photonic crystal structure having a dielectric constant distribution in a period "a" in a specific space direction, that is, in an x-direction herein.

In the photonic crystal structure, as illustrated in FIG. 6A, the intensity distribution of resonant light also becomes a distribution in the period "a". The light intensity is indicated by a binary value for easy description. A wavelength λ of light in the resonant mode is, for example, about a/2.

Next, description will be made on a photonic crystal structure having a dielectric constant distribution in which periodical modulation in a period "b" is added to a dielectric constant distribution having periodicity of the period "a", as illustrated in FIG. 7B.

In the photonic crystal structure, as illustrated in FIG. 7A as an example thereof, the intensity distribution of the light of wavelength resonance next to a resonant mode in FIG. 6A has periodicity of the period "b" in addition to periodicity of the period "a". The light intensity is discretely indicated for simplicity, but the light intensity distribution is essentially the same as actual light intensity distribution in a point of having such features as described above.

As illustrated by a region 710 in FIG. 7A, in a photonic crystal structure having a double period as described above, a region having a relatively low intensity periodically exists in the light intensity distribution in the resonant mode. The light intensity distribution in which a region having a relatively low intensity periodically exists does not appear with a photonic crystal structure of a single period.

By comparing a case in which a light absorber, for example, a conductive film or metal such as electrode exists near the region 710 with a case in which a light absorber exists similarly near, for example, a region 610 in FIG. 6A, loss of a resonator in the former is suppressed. By providing a location having small light intensity distribution and a conductive film in this way, current injection into the whole surface of a photonic crystal layer is implemented while a minimum influence of light absorption is being ensured, thus enabling a high power output.

For the periodicity of a photonic crystal structure, FIGS. 6A and 6B and FIGS. 7A and 7B illustrate only the periodicity in one-dimensional direction, but the photonic crystal structure may have a two-dimensional periodic structure.

EMBODIMENT

Referring now to accompanying drawings, description will be made on an embodiment of the present invention.

FIG. 1 illustrates a sectional schematic view illustrating a surface emitting laser in the present embodiment.

Figure 2:
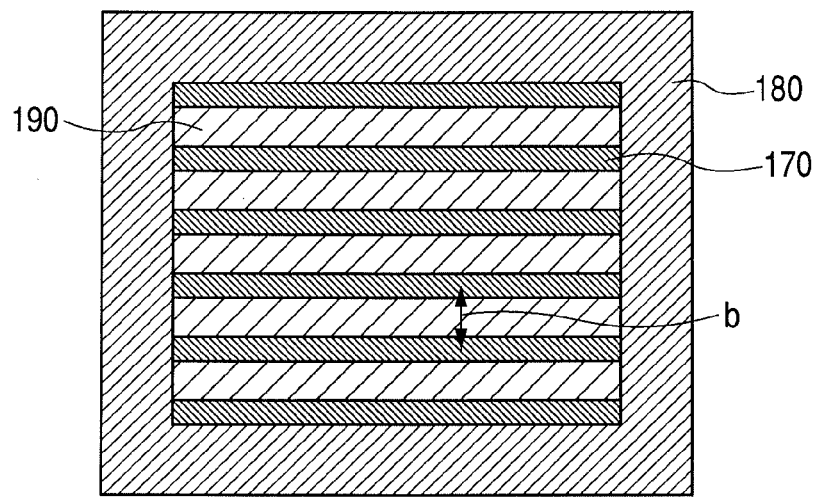
FIG. 2 is a top schematic view of a surface emitting laser according to one embodiment of the present invention.

FIG. 2 is a top schematic view of the surface emitting laser in FIG. 1.

In FIGS. 1 and 2, reference numeral 100 denotes a surface emitting laser, reference numeral 105 denotes a substrate, reference numeral 120 denotes a lower clad layer, reference numeral 125 denotes an active layer, reference numeral 130 denotes an upper clad layer, reference numeral 170 denotes a conductive film, reference numeral 180 denotes an upper electrode, reference numeral 185 denotes a lower electrode and reference numeral 190 denotes a photonic crystal structure.

As illustrated in FIG. 1, the surface emitting laser 100 in the present embodiment has the lower clad layer 120, the active layer 125 and the upper clad layer 130 on the substrate 105.

The upper clad layer 130 is provided with the conductive film 170 and the upper electrode 180, and the substrate 105 is provided with the lower electrode 185.

On the top of the upper clad layer 130 in the present embodiment, there is formed a photonic crystal structure 190 of two-dimensional hole lattice.

The upper electrode 180 has a ring shape so as to surround the photonic crystal structure 190.

Figure 3:
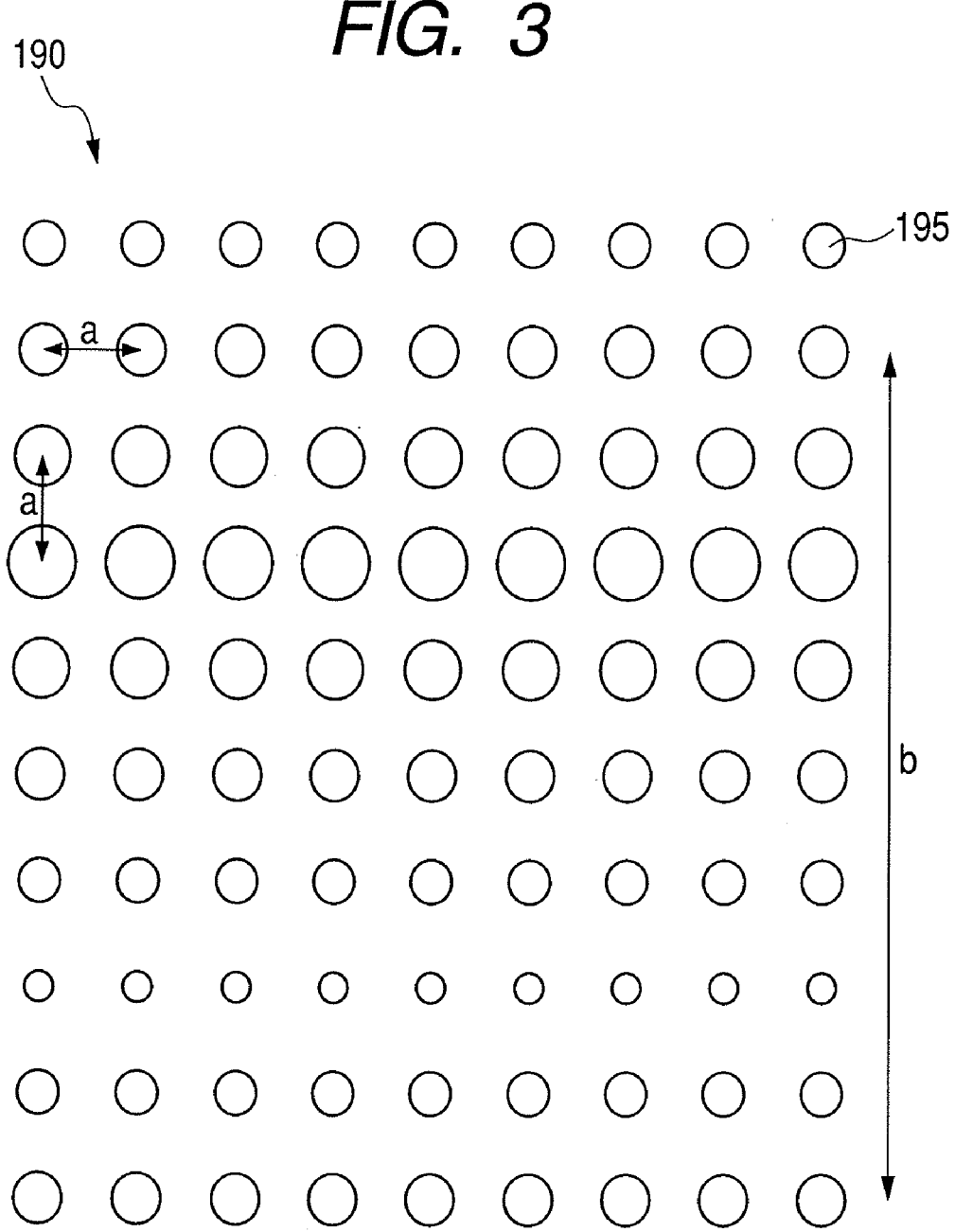
FIG. 3 is a top schematic view of a photonic crystal structure of a surface emitting laser according to one embodiment of the present invention.

FIG. 3 is a top schematic view of a pattern of the photonic crystal structure 190 according to the present embodiment.

In FIG. 3, reference numeral 195 denotes holes each obtained by etching an upper clad layer into a cylindrical shape. In the photonic crystal structure 190 according to the present embodiment, the holes 195 each obtained by etching an upper clad layer into a cylindrical shape are arranged in a two-dimensional square grid shape in a shorter period "a" than a laser resonance wavelength.

In the photonic crystal structure, the diameter of each of the holes is added to a period modulation in one-dimensional manner, and a period thereof is a longer period "b" than the laser resonance wavelength. For example, the period "b" is defined so as to be 20 times as large as the period "a" and a diameter of 20n+i-th hole (where, n is an integer, 0<=i<20) is defined so as to be (0.4−0.03×|10−i|)×a.

In the photonic crystal structure, the electric field intensity of a standing wave generated during light resonance is subjected to modulation corresponding to the long period "b" in addition to modulation corresponding to the short period "a". Specifically, a high or low level of the electric field intensity of the standing wave is periodically repeated in the long period "b".

In the upper clad layer, a conductive film is disposed at the position on the upper clad layer having low electric field intensity caused by the modulation corresponding to the long period "b", while on the upper clad layer having high electric field intensity, no conductive film is disposed.

At that time, it is desirable that the conductive film is a film thin to the degree that the resonator performance of photonic crystal structure will not be broken.

The conductive film can be made of, for example, indium-tin-oxide (ITO) of 100 nm in thickness.

The conductive film, made of conductive material, often has an optical absorption and the absorption thereof is generally remarkable in a visible light region and in particular, a short-wavelength region such as blue light.

Accordingly, if a conductive film is provided near a photonic crystal structure as a resonator, resonant light is absorbed there, and large absorption will disable laser oscillation.

However, like the configuration according to the present embodiment, by further applying modulation to a photonic crystal, giving a low or high intensity level to standing wave electric field intensity, selecting only a position having low electric field intensity and providing a conductive film at the position on an upper clad layer, light absorption can be suppressed more significantly than by attaching the conductive film over the whole surface of the upper clad layer.

In addition, formation of a conductive film allows carriers to be diffused through the conductive film, and carriers can be injected into an active layer having a wide area even if the inner diameter of a ring-shaped electrode is large.

Accordingly, the present embodiment can provide high current injection efficiency and high laser beam intensity.

Next, description will be made on a method for preparing the surface emitting laser 100 according to the present embodiment.

First, the lower clad layer 120, the active layer 125 and the upper clad layer 130 are layered on the substrate 105.

The substrate 105 is, for example, an n-type GaAs substrate.

The lower clad layer 120 and the upper clad layer 130 are made of n-type and p-type AlGaAs, respectively. The active layer 125 is of an AlGaInP series multiple quantum well structure and emits light by carrier injection.

The layering process uses an ordinary semiconductor film formation technology.

Next, the conductive film 170 is formed on the upper clad layer 130.

The conductive film 170 is, for example, made of indium-tin-oxide (ITO).

The photonic crystal structure 190 is prepared on the upper clad layer 130 and the conductive film 170. The photonic crystal structure 190 has a two-dimensional square grid-shaped hole row of the short period "a", and the diameter of holes is subjected to modulation in the long period "b". For example, the periods "a" and "b" are 300 nm and 6 μm, respectively.

The photonic crystal structure 190 is subjected to patterning by, for example, an electron beam lithography method and is formed by etching processing.

Furthermore, for example, using the photolithography method, patterning is performed at the long period "b" and, by etching, a part of the conductive film 170 is removed.

A position of removing the conductive film 170 is a portion on the upper clad layer having high standing wave electric field intensity in the long period "b" in a laser resonance mode. The standing wave electric field intensity is determined by a pattern of the photonic crystal structure 190.

By removing a part of the conductive film 170 by means of etching in this way, a conductive film is formed at a portion on the upper clad layer periodically modulated into a low intensity distribution.

Subsequently, the ring-shaped upper electrode 180 is disposed on the conductive film 170 and the lower electrode 185 is attached onto the bottom of the substrate.

The upper electrode 180 and the lower electrode 185 are, for example, Ti/Au and AuGe/Au, respectively.

The present embodiment describes that the photonic crystal structure 190 is of two-dimensional square grid-shaped array, but the photonic crystal structure 190 may be of two-dimensional triangular grid-shaped array.

Moreover, voids of the holes are filled with a dielectric material, such as SiN, or the like.

In addition, a pillar array may be used in place of a hole array.

Further, the present embodiment describes that long-period modulation for applying modulation to a hole diameter is one-dimensional, but the modulation may be two-dimensional.

Figure 4:
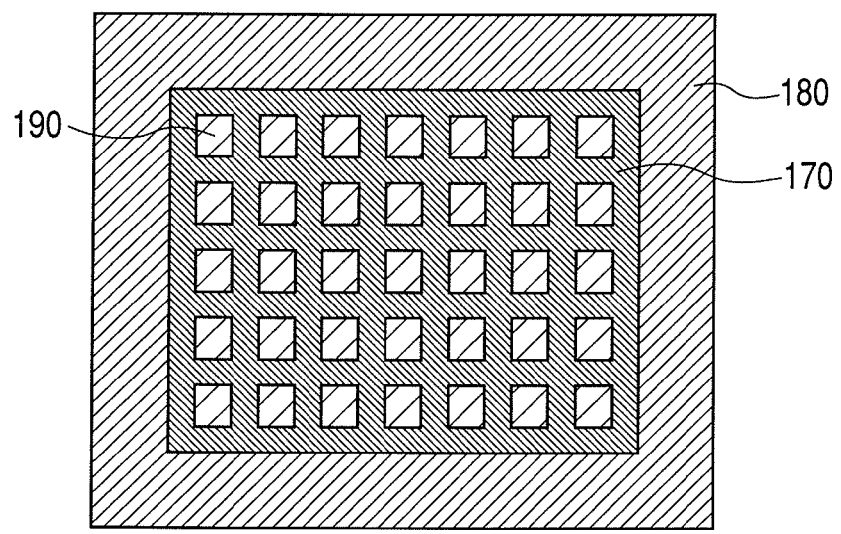
FIG. 4 is a top schematic view of another configurational example of a surface emitting laser according to one embodiment of the present invention.
Figure 5:
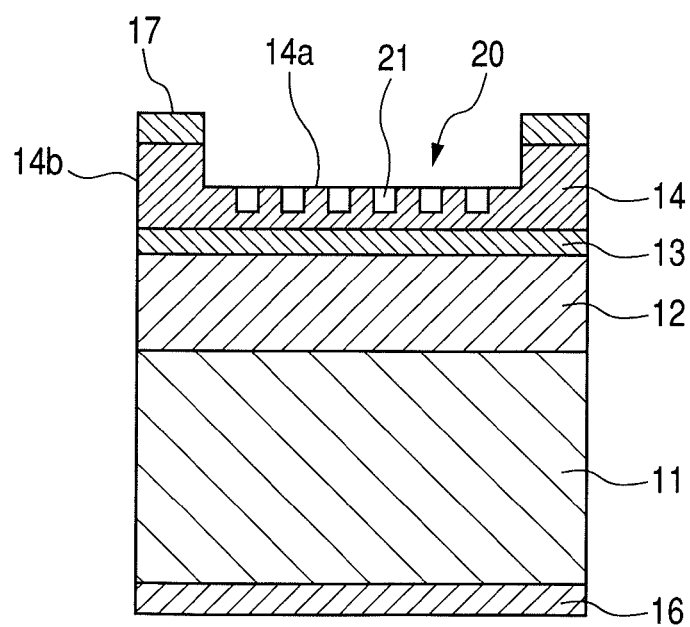
FIG. 5 is a sectional view of a two-dimensional photonic crystal surface emitting laser of Japanese Patent Application Laid-Open No. 2003-273453 in a conventional example.

In this case, a conductive film may be arranged in a mesh shape, as illustrated in the top view of FIG. 4, depending upon low standing wave electric field intensity.

In addition, the present embodiment describes that a method for applying modulation to a refractive index distribution in the photonic crystal structure 190 is modulation to a hole diameter, but modulation to a hole depth may be used.

Further, the conductive film may use the same material as the upper electrode.

Additionally, the surface emitting laser according to the present invention is not limited to the configuration of the present embodiment and may be changed in a variety of ways within the scope of the present invention.

In particular, materials of a semiconductor layer, a conductive film, a photonic crystal and an electrode and a refractive index distribution pattern of photonic crystal are optional.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-111318, filed Apr. 20, 2007, which is hereby incorporated by reference herein in its entirety.

What is claimed is:

1. A surface emitting laser comprising a photonic crystal layer on a substrate with an active layer intervening therebetween, wherein:
   the photonic crystal layer includes a first periodic structure for resonating in an in-plane direction and a second periodic structure for modulating a light intensity distribution in the in-plane direction;
   the light intensity in the photonic crystal layer is periodically distributed to a region having high light intensity and a region having low light intensity by the second periodic structure; and
   a conductive film for performing current injection into the active layer, the conductive film having approximately a same periodicity as a periodicity of the second periodic structure.

2. The surface emitting laser according to claim 1, wherein the first periodic structure is a short-periodic structure in a shorter period than a vacuum wavelength of light resonated in the in-plane direction, and
   the second periodic structure is a long-periodic structure in a longer period than the vacuum wavelength of light.

3. The surface emitting laser according to claim 2, wherein the short-periodic structure is of a two-dimensional square lattice of holes or a two-dimensional triangular lattice of holes.

4. The surface emitting laser according to claim 3, wherein the holes are filled with a dielectric material.

5. The surface emitting laser according to claim 2, wherein the long-periodic structure is configured by one-dimensionally or two-dimensionally adding a period modulation to a diameter of each of the holes or a depth of each of the holes.

6. The surface emitting laser according to claim 1, wherein the photonic crystal layer is provided with an upper electrode, with the conductive film intervening between the upper electrode and the photonic crystal layer.

7. The surface emitting laser according to claim 6, wherein the conductive film and the electrode are made of a same material.

8. The surface emitting laser according to claim 1, wherein the conductive film is formed with a thin film.

* * * * *